(12) United States Patent
Göötz et al.

(10) Patent No.: US 9,698,316 B2
(45) Date of Patent: Jul. 4, 2017

(54) METHOD FOR PRODUCING A LATERALLY STRUCTURED PHOSPHOR LAYER AND OPTOELECTRONIC COMPONENT COMPRISING SUCH A PHOSPHOR LAYER

(71) Applicant: OSRAM Opto Semiconductors GmbH, Regensburg (DE)

(72) Inventors: Britta Göötz, Regensburg (DE); Ion Stoll, Tegernheim (DE); Alexander F. Pfeuffer, Regensburg (DE); Dominik Scholz, Regensburg (DE); Isabel Otto, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/100,062

(22) PCT Filed: Jan. 20, 2015

(86) PCT No.: PCT/EP2015/050976
§ 371 (c)(1),
(2) Date: May 27, 2016

(87) PCT Pub. No.: WO2015/107211
PCT Pub. Date: Jul. 23, 2015

(65) Prior Publication Data
US 2017/0040500 A1   Feb. 9, 2017

(30) Foreign Application Priority Data
Jan. 20, 2014   (DE) .................. 10 2014 100 542

(51) Int. Cl.
*H01L 21/76*   (2006.01)
*H01L 33/50*   (2010.01)
(Continued)

(52) U.S. Cl.
CPC ............ *H01L 33/502* (2013.01); *C23C 28/00* (2013.01); *C23C 28/32* (2013.01); *C23C 28/345* (2013.01);
(Continued)

(58) Field of Classification Search
CPC ....... C23C 28/00; C23C 28/32; C23C 28/345; H01L 33/502
(Continued)

(56) References Cited

U.S. PATENT DOCUMENTS

| | | | |
|---|---|---|---|
| 5,120,591 A | 6/1992 | Tomita | |
| 6,120,339 A | 9/2000 | Alwan | |

(Continued)

FOREIGN PATENT DOCUMENTS

| | | | |
|---|---|---|---|
| DE | 10225778 A1 | 4/2003 | |
| DE | 102012208287 A1 | 11/2013 | |

(Continued)

*Primary Examiner* — Tan N Tran
(74) *Attorney, Agent, or Firm* — Slater Matsil, LLP

(57) ABSTRACT

A method for producing a laterally structured phosphor layer and an optoelectronic component comprising such a phosphor layer are disclosed. In an embodiment the method includes providing a carrier having a first electrically conductive layer at a carrier top side, applying an insulation layer to the first electrically conductive layer and a second electrically conductive layer to the insulation layer, etching the second electrically conductive layer and the insulation layer, wherein the first electrically conductive layer is maintained as a continuous layer. The method further includes applying a voltage to the first electrically conductive layer and electrophoretically coating the first electrically conductive layer with a first material, and applying a voltage to the second electrically conductive layer and electrophoretically coating the second electrically conductive layer with a second material.

17 Claims, 3 Drawing Sheets

(51) Int. Cl.
    *C25D 13/02*    (2006.01)
    *C25D 13/12*    (2006.01)
    *C25D 13/22*    (2006.01)
    *C23C 28/00*    (2006.01)
    *C23F 1/02*     (2006.01)
    *C23F 1/14*     (2006.01)

(52) U.S. Cl.
    CPC .................. *C23F 1/02* (2013.01); *C23F 1/14* (2013.01); *C25D 13/02* (2013.01); *C25D 13/12* (2013.01); *C25D 13/22* (2013.01); *H01L 33/504* (2013.01); *H01L 2933/0041* (2013.01)

(58) Field of Classification Search
    USPC ........................................ 438/408, 453, 454
    See application file for complete search history.

(56) References Cited

U.S. PATENT DOCUMENTS

| | | |
|---|---|---|
| 2002/0185965 A1 | 12/2002 | Collins, III et al. |
| 2008/0302559 A1 | 12/2008 | Leedy |
| 2011/0241031 A1 | 10/2011 | von Malm et al. |
| 2012/0223875 A1 | 9/2012 | Lau et al. |
| 2013/0309437 A1 | 11/2013 | Kraeuter |
| 2015/0207043 A1 | 7/2015 | Pfeuffer et al. |
| 2015/0279902 A1 | 10/2015 | Von Malm et al. |

FOREIGN PATENT DOCUMENTS

| | | |
|---|---|---|
| DE | 102012105691 A1 | 1/2014 |
| DE | 102012106859 A1 | 1/2014 |
| DE | 102012109460 A1 | 4/2014 |
| JP | 2005197190 A | 7/2005 |
| WO | 2013150455 A1 | 10/2013 |

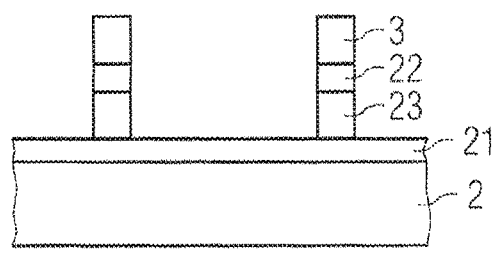
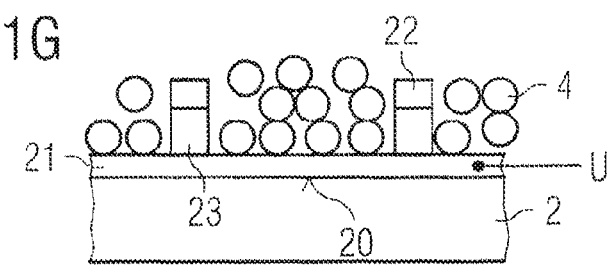
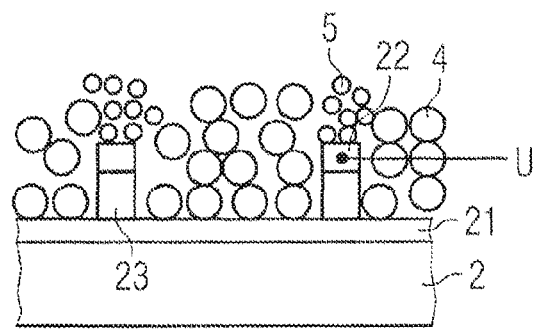
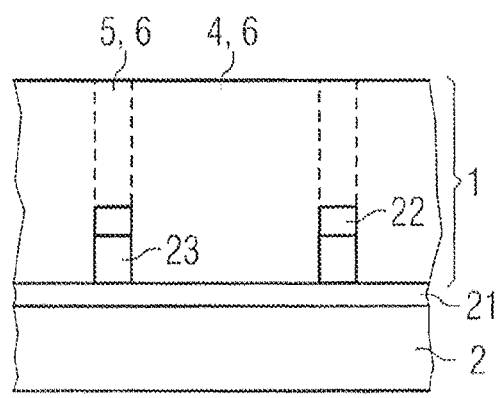
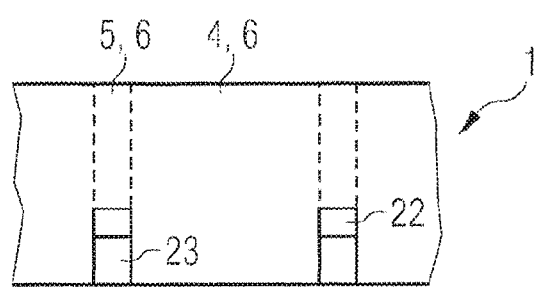

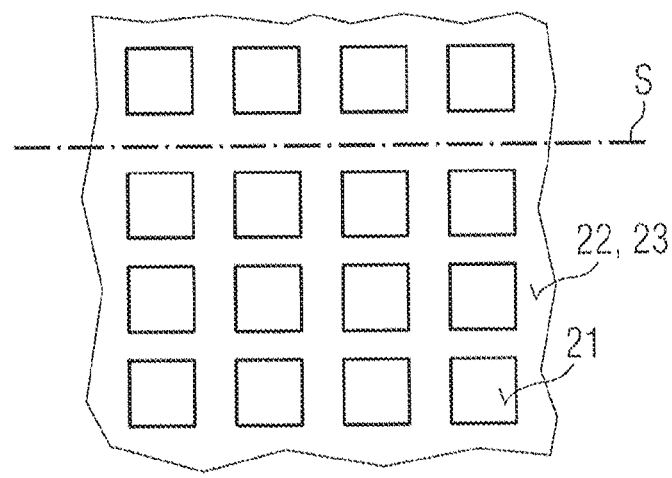
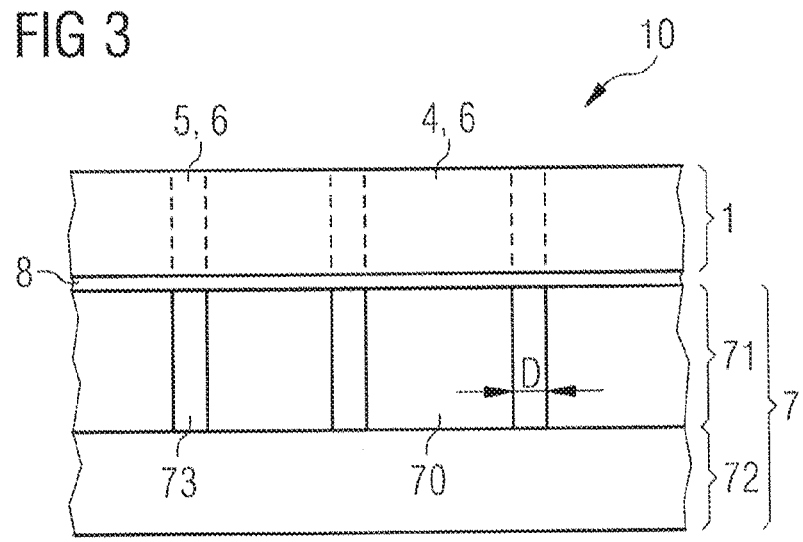

METHOD FOR PRODUCING A LATERALLY STRUCTURED PHOSPHOR LAYER AND OPTOELECTRONIC COMPONENT COMPRISING SUCH A PHOSPHOR LAYER

This patent application is a national phase filing under section 371 of PCT/EP2015/050976, filed Jan. 20, 2015, which claims the priority of German patent application 10 2014 100 542.2, filed Jan. 20, 2014, each of which is incorporated herein by reference in its entirety.

TECHNICAL FIELD

A method is provided for producing a laterally patterned layer, in particular a luminescent material plate. An optoelectronic semiconductor component having such a layer is furthermore provided.

SUMMARY OF THE INVENTION

Embodiments of the invention provide a method with which a laterally patterned layer can be produced efficiently.

According to at least one embodiment, a laterally patterned layer is produced with the method. Laterally patterned means in particular that the layer, when viewed in plan view onto a main face, has a plurality of sub-areas which differ with regard to the characteristics thereof. In particular, the sub-areas differ from one another in the material composition and/or the optical properties thereof. In the direction perpendicular to the main faces, materials may be distributed homogeneously or non-homogeneously in the sub-areas.

According to at least one embodiment, the method comprises the step of providing a carrier. The carrier may be a temporary carrier which is only present during the production method. The carrier is preferably mechanically stable, such that the carrier constitutes a or the mechanically load-bearing and supporting component of the layer to be produced.

According to at least one embodiment, the carrier comprises a first electrically conductive layer on the carrier top. The first electrically conductive layer may be an integral part of the carrier or also be applied onto the carrier top.

According to at least one embodiment, the method comprises the step of applying an electrical insulation layer onto the first electrically conductive layer. The insulation layer is preferably applied homogeneously and in a uniform layer thickness over the entire surface of the first electrically conductive layer. The first electrically conductive layer may here also be a continuous, unpatterned layer having a thickness which is constant within the bounds of manufacturing tolerances.

According to at least one embodiment, a second electrically conductive layer is applied onto the insulation layer. The second electrically conductive layer is preferably applied unpatterned, as may also be the case for the first electrically conductive layer. The first and the second electrically conductive layers are electrically insulated from one another by the insulation layer.

The first electrically conductive layer, the insulation layer and the second electrically conductive layer are preferably in each case formed of a single layer. Alternatively, it is possible for a combination of a plurality of sublayers to be used for these layers. In the direction away from the carrier, the insulation layer preferably directly follows the first electrically conductive layer and the second electrically conductive layer preferably directly follows the insulation layer.

According to at least one embodiment, an etching mask is applied onto a side of the second electrically conductive layer remote from the carrier. The etching mask is preferably photolithographically patterned. The etching mask is, for example, formed from a photoresist layer.

According to at least one embodiment, the second electrically conductive layer and the insulation layer are etched. Etching proceeds in patterned manner, patterning being predetermined by the etching mask. In particular, the second electrically conductive layer and the insulation layer are in places completely removed from the first electrically conductive layer during etching, such that the first electrically conductive layer is exposed in places after etching.

According to at least one embodiment, the first electrically conductive layer is not or is not significantly impaired or removed during etching. In particular, the first electrically conductive layer is retained as a continuous, unpatterned or substantially unpatterned layer.

According to at least one embodiment, a voltage is applied for a time to the first electrically conductive layer. The first electrically conductive layer is then coated with a first material by means of electrophoresis. The first electrically conductive layer is preferably coated with the first material in all areas which are not covered by the insulation layer.

According to at least one embodiment, a voltage is applied to the second electrically conductive layer and a second material is deposited by means of electrophoresis onto the second electrically conductive layer. The second electrically conductive layer is here preferably free of the first material. In other words, the first material is then selectively deposited onto the first electrically conductive layer and the second material is preferably selectively deposited onto the second electrically conductive layer.

In at least one embodiment, the method is designed to produce a laterally patterned layer, in particular a luminescent material plate. The method comprises at least the following steps: providing a carrier with a first electrically conductive layer on a carrier top, applying an insulation layer onto the first electrically conductive layer and a second electrically conductive layer onto the insulation layer, applying and patterning an etching mask onto the second electrically conductive layer, etching the second electrically conductive layer and the insulation layer, wherein the first electrically conductive layer is retained as a continuous layer, applying a voltage to the first electrically conductive layer and electrophoretically coating the first electrically conductive layer with a first material, and applying a voltage to the second electrically conductive layer and electrophoretically coating the second electrically conductive layer with a second material.

According to at least one embodiment, the method steps of the method described herein are carried out in the stated order. Alternatively, it is possible for the coating with the first and the second material to be carried out in the reverse order.

In particular for pixelated light-emitting diode chips, a luminescent material for wavelength conversion has to be applied in a purposefully patterned manner onto individual or a plurality of pixels. It is here also often necessary for adjacent pixels to be optically isolated from one another so as to avoid optical crosstalk between adjacent pixels. Such optical isolation from one another enables high contrast, for example between adjacent pixels which are switched on and switched off.

Such pixelated light-emitting diode chips are for example photolithographically patterned in order to be able to achieve comparatively small pattern sizes. It is thus also necessary for the purposes of optical isolation for it to be possible in the same way to provide a luminescent material mounted on the light-emitting diode chip material with comparatively small pattern sizes. It is possible by means of the method described herein, using a photolithographically produced mask, to produce a layer with laterally patterned optical characteristics, for example with luminescent material regions and with radiation-opaque regions, with the required accuracy. Because the first electrically conductive layer and the second electrically conductive layer are separately electrically addressable, specifically the first material and the second material can be selectively deposited in specific regions on the carrier.

According to at least one embodiment, the laterally patterned layer is a luminescent material plate. In other words, the layer then comprises one or more luminescent materials. The luminescent material plate is designed to be applied onto an optoelectronic semiconductor chip such as a light-emitting diode chip. In particular, the laterally patterned layer is designed and is sufficiently mechanically stable to be handled by a pick-and-place process.

According to at least one embodiment, the first material is a luminescent material or a luminescent material mixture or comprises a luminescent material or a luminescent material mixture. The following materials may for example be used as the luminescent material: rare earth metal-doped garnets, rare earth metal-doped alkaline earth metal sulfides, rare earth metal-doped thiogallates, rare earth metal-doped aluminates, rare earth metal-doped silicates, rare earth metal-doped orthosilicates, rare earth metal-doped chlorosilicates, rare earth metal-doped alkaline earth metal silicon nitrides, rare earth metal-doped oxynitrides, rare earth metal-doped aluminum oxynitrides, rare earth metal-doped silicon nitrides or rare earth metal-doped SiAlON materials and/or rare earth metal-doped SiON materials. $Ce^{3+}$-doped garnets, for instance YAG:Ce and LuAG:Ce, are in particular suitable as luminescent materials. $Eu^{2+}$-doped nitrides, such as $CaAlSiN_3$:$Eu^{2+}$, $(Ba,Sr)_2Si_5N_8$:$Eu^{2+}$; $Eu^{2+}$-doped sulfides, SiAlON:$Eu^{2+}$, orthosilicates, such as for example $(Ba,Sr)_2SiO_4$:$Eu^{2+}$, barium magnesium aluminate:$Eu^{2+}$ and/or halophosphates are in particular also suitable as luminescent materials.

According to at least one embodiment, the second material is a material which reflects or absorbs visible light. In particular, the reflective action may arise in association with a refractive index difference towards a material which surrounds the second material. The second material for example comprises or is one of the following materials:

$SiO_2$, $Al_2O_3$, $TiO_2$, $ZrO_2$, $HfO_2$, graphite, carbon black or carbon nanotubes. Alternatively or additionally, the second material comprises an oxide, a sulfide and/or a cyanide of a transition metal or a rare earth, in particular as an inorganic pigment for establishing a specific color appearance.

According to at least one embodiment, after the etching step the second electrically conductive layer takes the form of a grid when viewed in plan view. In particular, the second electrically conductive layer is then a single, electrically contiguous pattern.

According to at least one embodiment, prior to the step of coating with the first and the second material and after the etching step, the first electrically conductive layer is formed by a plurality of island-like regions which are surrounded in each case in the manner of a frame by the second electrically conductive layer. In other words, when viewed in plan view, the first electrically conductive layer is located in meshes of the grid formed by the second electrically conductive layer. The first electrically conductive layer and the second electrically conductive layer are here preferably located in two different planes parallel to the carrier top.

According to at least one embodiment, the first material and/or the second material are deposited in the form of particles. The particles may in each case be formed by a homogeneous material. It is likewise possible for the particles to be composite particles, for example having a core of titanium dioxide and having a coating of aluminum oxide and/or silicon oxide.

According to at least one embodiment, an average particle diameter of the particles of the first material exceeds an average particle diameter of the particles of the second material at least by a factor of 2 or 3 or 5 or 10. In other words, the particles of the second material are then significantly smaller than the particles of the first material.

According to at least one embodiment, the first and the second electrically conductive layers taken together, when viewed in plan view, completely cover the carrier top after the etching step and before the coating step. In other words, it is then possible for the first and the second electrically conductive layers to adjoin directly when viewed in plan view. In particular as a result of the insulation layer, when viewed in plan view, no or no significant nonconductive intermediate region is then present between the first and the second electrically conductive layers.

According to at least one embodiment, the second electrically conductive layer together with the insulation layer is selectively etchable, in particular selectively wet chemically or dry chemically etchable, relative to the first electrically conductive layer. Selectively etchable may mean that etching rates of the materials present in the layers differ from one another at least by a factor of 5 or 10 or 50 or 100.

According to at least one embodiment, after coating with the first and/or the second material, a matrix material is applied onto the carrier top. The matrix material enables production of a contiguous, laterally patterned layer in particular in the form of a single, contiguous plate. In other words, the matrix material then constitutes a binder between the first material and the second material, in particular between the respective particles. A gapless, continuous layer is achievable thanks to the matrix material. The matrix material is applied, for example, by pressing or transfer molding, by spin-coating or by dispensing.

According to at least one embodiment, the matrix material is radiation-transmissive in the visible range of the spectrum. The matrix material is likewise preferably aging-resistant. The matrix material is, for example, a silicone, a silicone hybrid material such as a silicone/epoxy hybrid material, a polysilazane, a parylene or a low-melting glass.

According to at least one embodiment, the matrix material comprises a third material or a third material is added thereto. The third material for example assumes particulate form. The diameter of the particles of the matrix material is for example in the same size range as the diameter of the particles of the first material and/or the second material. The third material may be a further luminescent material or a luminescent material mixture.

According to at least one embodiment of the method, the step of providing the carrier includes depositing the first electrically conductive layer onto the carrier top. The carrier is here preferably formed from an electrically insulating material. Deposition of the first electrically conductive layer proceeds for example by vapor deposition, by gas-phase deposition or by sputtering, as is likewise possible for the second electrically conductive layer.

According to at least one embodiment, the first electrically conductive layer is formed from a transparent conductive oxide such as ZnO or indium-tin oxide, ITO for short. Alternatively, the first electrically conductive layer may also comprise a metal or plurality of metals.

According to at least one embodiment, the first electrically conductive layer has a thickness of at least 50 nm or 75 nm or 100 nm. Alternatively or additionally, this thickness of the first electrically conductive layer is at most 2 μm or 1 μm or 400 nm.

According to at least one embodiment, the insulation layer is formed from an electrically insulating oxide or nitride or oxynitride, in particular from silicon oxide or silicon nitride or aluminum oxide or aluminum nitride.

According to at least one embodiment, the insulation layer has a thickness of at least 100 nm or 150 nm or 200 nm and/or of at most 1.5 μm or 800 nm or 500 nm.

According to at least one embodiment, the second electrically conductive layer comprises one or more metallic layers. For example, the second electrically conductive layer contains titanium, tungsten, aluminum and/or calcium. Alternatively or additionally, the second electrically conductive layer may comprise or consist of a semiconductor material such as silicon or gallium nitride. It is also possible for the second electrically conductive layer to be formed from a transparent conductive oxide such as zinc oxide. If the second electrically conductive layer is formed from a semiconductor material, doping may additionally be present.

According to at least one embodiment, the first material has an average particle diameter of at least 2 μm or 7 μm and/or of at most 25 μm or 13 μm. Alternatively or additionally, the average diameter of the particles of the second material is at least 50 nm or 100 nm or 150 nm and/or at most 5 μm or 1 μm or 500 nm. A $d_{50}$ value is in particular used as the average particle diameter.

According to at least one embodiment, the finished laterally patterned layer has a thickness of at least 10 μm or 20 μm or 30 μm. Alternatively or additionally, this thickness is at most 250 μm or 150 μm or 90 μm. The thickness of the layer may here be a uniform thickness. Alternatively, it is possible for the thickness of the layer to be purposefully patterned, for example in the same manner as the second electrically conductive layer, when viewed in plan view.

According to at least one embodiment, after coating with the first and the second material and preferably after applying the matrix material, the carrier is removed from the laterally patterned layer which has been produced. For example, the carrier is detached wet chemically. Alternatively, it is also possible for the carrier to be photochemically detached.

According to at least one embodiment, after detachment from the carrier, the first electrically conductive layer, the second electrically conductive layer and/or the insulation layer remain partially or completely on the laterally patterned layer. In particular, the second electrically conductive layer may be present in the laterally patterned layer, thus in particular in the luminescent material plate. Such remaining regions of the in particular second electrically conductive layer mean that the method is also clearly evident from the finished product.

An optoelectronic semiconductor component is furthermore provided. The semiconductor component comprises at least one luminescent material plate which is produced by a method according to at least one of the preceding embodiments. Features of the method are therefore also disclosed for the semiconductor component and vice versa.

In at least one embodiment, the optoelectronic semiconductor component comprises at least one optoelectronic semiconductor chip, in particular at least one light-emitting diode chip for generating visible light. The light-emitting diode chip preferably emits blue light. The semiconductor component furthermore contains at least one luminescent material plate. The luminescent material plate is mounted on the light-emitting diode chip, in particular on a main radiation side. The light-emitting diode chip is here patterned into a plurality of individual pixels. The individual pixels or groups of individual pixels may preferably be separately and mutually independently electrically driven.

According to at least one embodiment, patterning of the light-emitting diode chips corresponds to the pixels of a patterning of the luminescent material plate in regions having the first material and in regions having the second material. For example, regions only having the first material are in each case located over the light-emitting pixels. Sub-areas of the luminescent material plate which only comprise the second material for optical isolation are preferably located over intermediate regions between adjacent pixels. In this manner, it is possible for a 1:1 assignment to be achieved between regions having the first material and the pixels. The radiation-opaque second material thus provides optical isolation for preventing optical crosstalk between adjacent pixels.

According to at least one embodiment, the average distance between adjacent pixels, when viewed in plan view, amounts to at least 1 μm or 2 μm or 3 μm or 5 μm. Alternatively or additionally, the pixel spacing is at most 30 μm or 15 μm or 12 μm.

According to at least one embodiment, when viewed in plan view, the region having the second material of the luminescent material plate has a width which, with a tolerance of at most a factor of 3 or 2 or 1.5 or 1.25, is equal to the pixel spacing. In other words, the regions having the second material may extend congruently with interspaces between adjacent pixels of the light-emitting diode chip, when viewed in plan view.

According to at least one embodiment, the light-emitting diode chip is produced from a single semiconductor layer sequence. The semiconductor layer sequence in particular extends with an unmodified composition and with identical layers over the entire light-emitting diode chip. The semiconductor layer sequence is here preferably grown contiguously along precisely one growth direction. The light-emitting diode chip and the pixelation thereof is then for example produced by photolithographic patterning of the semiconductor layer sequence, wherein the individual pixels are no longer moved relative to one another after selective removal of material of the semiconductor layer sequence. In other words, the pixels are then solely produced and positioned by etching a contiguous semiconductor layer sequence and not by a rearrangement process or relocation.

BRIEF DESCRIPTION OF THE DRAWINGS

A method described herein and an optoelectronic semiconductor component described herein will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

In the drawings:

FIG. 1D-1F show patterning the layer structure on the carrier, FIGS. 1G-1H show depositing first and second particles materials on the layers on the carrier, FIG. 1I-1J show forming a matrix material FIG. 2 shows a plan view of a patterned, electrically conductive layers structure disposed on a carrier, and FIG. 3 is a schematic sectional representation of an optoelectronic semiconductor component described herein.

DETAILED DESCRIPTION OF ILLUSTRATIVE EMBODIMENTS

FIG. 1A-1J illustrate a production method for a laterally patterned layer. The finished laterally patterned layer is particularly preferably a luminescent material plate 1.

Figure 1A:
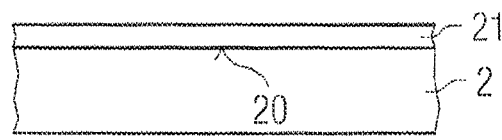
FIG. 1A-1C show several method steps for depositing layer(s) disposed on a carrier.

According to FIG. 1A, a carrier 2 is provided with a carrier top 20. The carrier 2 is, for example, a sapphire wafer. Other electrically insulating materials may, however, likewise be used. A first electrically conductive layer 21 is applied onto the carrier top 20, for example by means of sputtering or gas-phase deposition. The first electrically conductive layer 21 is for example formed from ZnO and has a thickness of approximately 150 nm.

Alternatively, it is also possible to use an electrically conductive substrate 2. In this case, the first electrically conductive layer 21 is part of the carrier 2 and the carrier top 20.

Figure 1B:
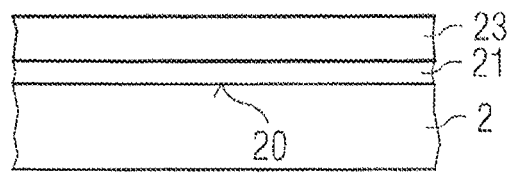

FIG. 1B illustrates deposition of an insulation layer 23 onto the first electrically conductive layer 21. The insulation layer 23 is electrically insulating. For example, the insulation layer 23 is formed from $Si_3N_4$. The thickness of the insulation layer 23 is for example approximately 350 nm.

Figure 1C:
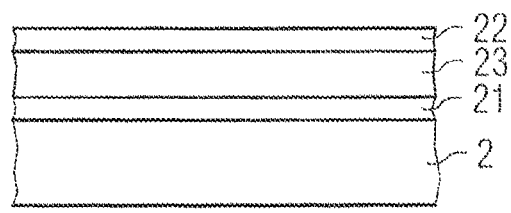

FIG. 1C shows continuous deposition of a second electrically conductive layer 22 onto the insulation layer 23. For example, the second electrically conductive layer 22 is formed from Ti/TiW:N. The thickness of the second electrically conductive layer 22 amounts for example to approximately 300 nm.

Layers 21, 23 and 22 follow one another in direct succession. The total thickness of layers 21, 23 and 22 is in particular at most 2 μm or 1.5 μm or 1 μm. Layers 21, 23 and/or 22 may alternatively or additionally be patterned by laser machining or by mechanical scribing.

Figure 1D:
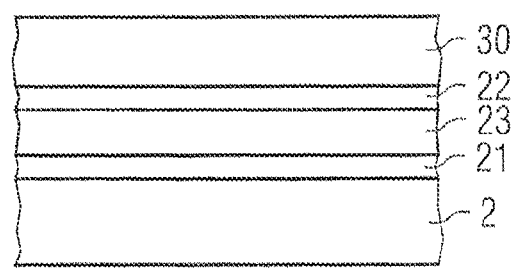
Figure 1E:
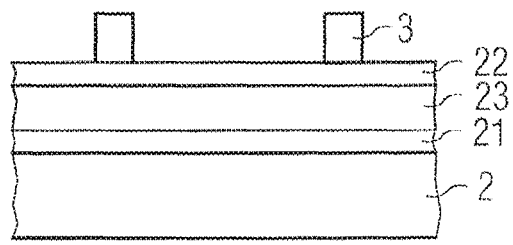

As shown in FIG. 1D, a photoresist layer 30 is applied onto layers 21, 23 and 22. The photoresist layer 30 is photolithographically patterned in such a manner that a mask 3 is obtained which partially covers layers 21, 23 and 22. The mask 3 is illustrated schematically in FIG. 1E.

FIG. 1F shows patterning of the insulation layer 23 and the second electrically conductive layer 22 by etching with the assistance of the mask 3. The resultant pattern of layers 22 and 23 here preferably corresponds to the pattern of the mask 3. The etching is for example wet chemical etching with buffered hydrofluoric acid, BOE for short, or dry chemical etching for instance with fluorine plasma. Layers 22 and 23 are here preferably selectively etchable relative to the first electrically conductive layer 21.

An extent of layers 22 and 23 in a direction parallel to the carrier top 20 is here preferably greater at least by a factor of 5 or 10 or 50 than the total thickness of layers 22 and 23.

An average extent of the exposed regions of the first conductive layer 21, in a direction parallel to the carrier top 20, is preferably at least 20 μm or 50 μm or 100 μm. The average extent of the exposed regions of the first electrically conductive layer 21 in particular exceeds the average extent of the remaining regions of layers 22 and 23 at least by a factor of 5 or 10.

The resultant pattern of the electrically conductive layers 21 and 22 from FIG. 1F is shown in the schematic plan view according to FIG. 2. The second electrically conductive layer 22 forms a grid in which island-like, for example rectangular, regions of the first electrically conductive layer 21 are exposed. Both electrically conductive layers 21 and 22 are preferably in each case contiguous and/or one-piece layers.

It is optionally possible for a greater distance to be provided between some of the exposed regions of the first electrically conductive layer 21. A separation line S may be provided in such regions for subdividing the laterally patterned coating into individual luminescent material plates 1.

According to FIG. 1G, a voltage U is applied to the first electrically conductive layer 21. Particles of a first material 4 are deposited onto exposed regions of the first electrically conductive layer 21 by electrophoresis, in particular in an electrophoresis dip bath. The first material 4 is preferably luminescent material particles.

Unlike in the illustration, the average diameter of the luminescent material particles 4 is preferably distinctly greater than the height of the insulation layer 23 together with the second electrically conductive layer 22. A lateral extent, in a direction parallel to the carrier top 20, of the remaining regions of the insulation layer 23 and the second electrically conductive layer 22 is preferably likewise greater than or equal to the average diameter of the luminescent material particles 4.

According to FIG. 1H, the voltage U is then applied to the second electrically conductive layer 22 and a second material 5 is selectively deposited over the second electrically conductive layer 22. The second material 5 is for example titanium dioxide particles. The particles of the second material 5 preferably have a smaller diameter than the particles of the first material 4.

Unlike in the illustration, the second material 5 may also be deposited before the first material 4 is deposited. It is furthermore optionally possible for a thin, continuous layer of the second material 5 to be deposited on a side of the first material 4 remote from the carrier 2.

According to FIG. 1I, a matrix material 6 is applied onto the first material 4 and onto the second material 5. The regions having the first and the second materials 4 and 5 are schematically divided from one another in FIG. 1I by dashed lines. Unlike in the illustration, it is possible for a side of the luminescent material plate 1 remote from the carrier 2 to have patterning and not a smooth top.

In FIG. 1J, the carrier 2 has been removed from the luminescent material plate 1. The first electrically conductive layer 21 has preferably also been completely removed from the matrix material 6 having materials 4 and 5, unlike in the illustration.

Optionally, however, it is also possible for the insulation layer 23 and/or the second electrically conductive layer 22 partially or completely to remain on the luminescent material plate 1, see FIG. 1J. Preferably, however, the materials of layers 22 and 23 are removed from the luminescent material plate 1. This removal is effected, for example, by selective etching. If layers 22 and 23 are removed, it is possible for a grid pattern to remain on the bottom of the luminescent material plate 1. This grid pattern then corresponds to a negative of the grid pattern, as shown in FIG. 2.

FIG. 3 shows an optoelectronic semiconductor component 10. The semiconductor component 10 comprises a luminescent material plate 1, in particular as produced in connection with FIG. 1. To simplify the illustration, the grid-like pattern on the luminescent material plate 1 resulting from the removal of layers 22 and 23 is not shown.

The semiconductor component 10 furthermore comprises a light-emitting diode chip 7. The light-emitting diode chip 7 comprises a semiconductor layer sequence 71 which has been patterned, for instance by etching, into individual pixels 70. The pixels 70 are located on a common chip carrier 72, which preferably also contains electrical interconnection of the pixels 70. The light-emitting diode chip 7 is, for example, a chip as is described in connection with documents US 2011/0241031 A1 or DE 10 2012 109 460 A1. The disclosure content of these documents is hereby included by reference.

A distance D between adjacent pixels 70 is for example approximately 5 µm and corresponds to the width of the regions of the luminescent material plate 1 having the second material 5. A interlayer 23 is preferably located between adjacent pixels 70. The pixels can be optically isolated from one another within the semiconductor layer sequence 71 by way of the interlayer 23.

The luminescent material plate 1 is mounted on the semiconductor layer sequence 21, for example by way of an adhesive layer 8. The adhesive layer 8 is preferably thin, preferably with a thickness of at most 5 µm or at most 1 µm. The adhesive layer 8 preferably consists of at least one transparent, radiation-transmissive material. Alternatively, it is possible for the luminescent material plate 1 to be applied directly onto the semiconductor layer sequence 21, for example in a partially crosslinked state with subsequent complete crosslinking to form a bond.

The regions having the first material 4 effect in particular partial wavelength conversion of radiation from the semiconductor layer sequence 71 into radiation of a different, further wavelength. The pixels 70 are optically isolated from one another by way of the regions having the second material 5, such that optical crosstalk between adjacent pixels is greatly reduced or prevented at least within the luminescent material plate 1.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing a laterally patterned layer, the method comprising:
   providing a carrier with a first electrically conductive layer on a carrier top;
   applying an insulation layer onto the first electrically conductive layer;
   applying a second electrically conductive layer onto the insulation layer;
   applying and patterning an etching mask onto the second electrically conductive layer;
   etching the second electrically conductive layer and the insulation layer, wherein the first electrically conductive layer is retained as a continuous layer;
   applying a first voltage to the first electrically conductive layer;
   electrophoretically coating the first electrically conductive layer with a first material;
   applying a second voltage to the second electrically conductive layer; and
   electrophoretically coating the second electrically conductive layer with a second material.

2. The method according to claim 1, wherein the laterally patterned layer is a luminescent material plate, wherein the first material is a luminescent material or a luminescent material mixture, wherein the second material contains or is a material which reflects or absorbs visible light, and wherein, after etching, the second electrically conductive layer forms a grid when viewed in plan view such that the first electrically conductive layer, when viewed in plan view, is subdivided into a plurality of regions surrounded in the manner of a frame.

3. The method according to claim 1, wherein the first and the second materials are, in each case, deposited as particles, and wherein an average particle diameter of the particles of the second material is at least by a factor of 3 smaller than an average particle diameter of the particles of the first material.

4. The method according to claim 1, wherein, after etching, the first and the second electrically conductive layers taken together, when viewed in plan view, completely cover the carrier top.

5. The method according to claim 1, wherein the second electrically conductive layer and the insulation layer are selectively wet chemically etchable relative to the first electrically conductive layer.

6. The method according to claim 1, wherein, after coating, a matrix material is placed onto the first and second materials such that the laterally patterned layer is a single, contiguous plate, and wherein the matrix material contains at least one of a silicone, a silicone/epoxy hybrid material, a polysilazane and a parylene.

7. The method according to claim 6, wherein a third material in form of particles is added to the matrix material and the third material is a luminescent material or a luminescent material mixture.

8. The method according to claim 1, wherein the carrier is electrically insulating.

9. The method according to claim 1, wherein the first electrically conductive layer comprises a transparent conductive oxide and has a thickness between 50 nm and 400 nm inclusive, wherein the insulation layer is formed from a silicon oxide or a silicon nitride and has a thickness between 150 nm and 800 nm inclusive, wherein the second electrically conductive layer comprises a metallic layer with Ti, W, Al and/or Ca and has a thickness between 50 nm and 500 nm inclusive, wherein the first material is a luminescent material and has an average particle diameter of between 7 µm and 13 µm inclusive, wherein the second material has an average particle diameter of between 100 nm and 500 nm inclusive and is a titanium oxide, silicon oxide, aluminum oxide, carbon black or graphite, and wherein a thickness of a finished luminescent material plate is between 20 µm and 150 µm inclusive.

10. The method according to claim 1, wherein the first electrically conductive layer comprises a transparent conductive oxide and has a thickness between 50 nm and 400 nm inclusive.

11. The method according to claim 1, wherein the insulation layer is formed from a silicon oxide or a silicon nitride and has a thickness between 150 nm and 800 nm inclusive.

12. The method according to claim 1, wherein the second electrically conductive layer comprises a metallic layer with Ti, W, Al and/or Ca and has a thickness between 50 nm and 500 nm inclusive.

13. The method according to claim 1, wherein the first material is a luminescent material and has an average particle diameter of between 7 μm and 13 μm inclusive.

14. The method according to claim 1, wherein the second material has an average particle diameter of between 100 nm and 500 nm inclusive and is a titanium oxide, silicon oxide, aluminum oxide, carbon black or graphite.

15. The method according to claim 1, wherein the thickness of the finished luminescent material plate is between 20 μm and 150 μm inclusive.

16. The method according to claim 1, wherein the method is carried out in the stated order.

17. The method according to claim 1, further comprising, after coating with the first and the second materials, removing the carrier from the laterally patterned layer, wherein at least one of the first electrically conductive layer, the second electrically conductive layer and the insulation layer remain partially or completely on the laterally patterned layer.

* * * * *